US010491998B1

(12) United States Patent
Kominar

(10) Patent No.: US 10,491,998 B1
(45) Date of Patent: Nov. 26, 2019

(54) VEHICLE COMMUNICATION SYSTEMS AND METHODS OF OPERATING VEHICLE COMMUNICATION SYSTEMS

(71) Applicant: BlackBerry Limited, Waterloo (CA)

(72) Inventor: Jeremy Lawson Kominar, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 16/113,306

(22) Filed: Aug. 27, 2018

(51) Int. Cl.
*H03G 3/20* (2006.01)
*H04R 3/12* (2006.01)
*H04R 29/00* (2006.01)
*G10L 25/78* (2013.01)
*H04R 1/40* (2006.01)

(52) U.S. Cl.
CPC ................ *H04R 3/12* (2013.01); *G10L 25/78* (2013.01); *H04R 1/403* (2013.01); *H04R 29/002* (2013.01); *H04R 2430/01* (2013.01); *H04R 2499/13* (2013.01)

(58) Field of Classification Search
CPC .................. G10L 2021/02082; B60R 16/0373
USPC .................................................... 381/86, 110
See application file for complete search history.

(56) References Cited

U.S. PATENT DOCUMENTS

| | | | | |
|---|---|---|---|---|
| 8,050,419 | B2 | 11/2011 | Gerlach | |
| 8,738,368 | B2 | 5/2014 | Gratke et al. | |
| 9,509,820 | B2 | 11/2016 | Gopinath | |
| 2009/0245533 | A1 * | 10/2009 | Gerlach | H03G 3/32 381/86 |
| 2015/0265200 | A1 | 9/2015 | Mahdi et al. | |

* cited by examiner

*Primary Examiner* — George C Monikang
(74) *Attorney, Agent, or Firm* — Rowand LLP

(57) ABSTRACT

Communication systems in a vehicle and methods of operating the same. The vehicle has a safety belt securable around a vehicle occupant. The system includes processor executable instructions for detecting, at a microphone, a first acoustic input and, in response, determining that the first acoustic input corresponds to audible speech at a speech time. The system detects vibration associated with a speaking vehicle occupant at a vibration time using a vibration sensor associated with the safety belt. The system determines whether the vibration time substantially corresponds to the speech time to identify whether the audible speech originates from the vehicle occupant on which the first safety belt is secured about. In response to identifying that the audible speech originates from the vehicle occupant associated with safety belt, the system adjusts loudspeaker output of at least one loudspeaker.

20 Claims, 6 Drawing Sheets

VEHICLE COMMUNICATION SYSTEMS AND METHODS OF OPERATING VEHICLE COMMUNICATION SYSTEMS

FIELD

The present application generally relates to vehicle communication systems and, in particular, systems and methods for operating vehicle communication systems.

BACKGROUND

Vehicle communication systems enhance the aural experience for vehicle occupants. Such communication systems can include speakers providing acoustic output and one or more microphones receiving acoustic input for voice commands or for hands-free communication operations. Some systems are configured to detect acoustic input and to analyze the detected acoustic input for determining that a vehicle occupant has spoken. Such analysis can be dependent on speech recognition operations.

Further, it can be desirable to reduce acoustic output (e.g., music playing on the radio) such that vehicle occupants can conduct hands-free operations or conduct a conversation with other vehicle occupants. A vehicle occupant can reduce acoustic output by manually actuating an input device (e.g., volume control knob, volume control button, or touch input) of the vehicle communication system. However, it can be cumbersome to repetitively manipulate a volume control knob for decreasing the loudspeaker output volume prior to an intra-vehicle conversation and for restoring the loudspeaker output volume to previous levels upon completion of the intra-vehicle conversation.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
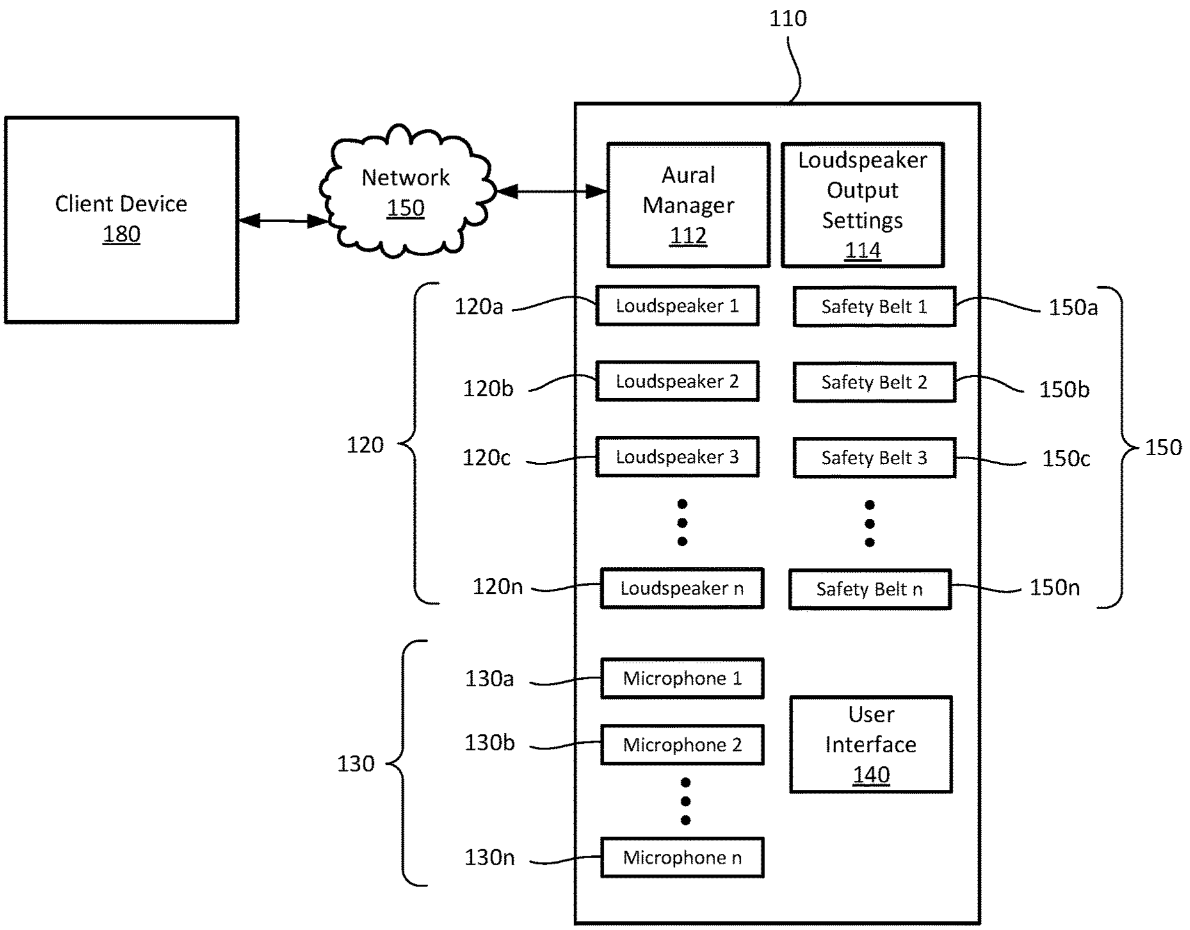
FIG. 1 illustrates, in block diagram form, a vehicle communication system 100, in accordance with an example of the present application.

In a first aspect, the present application describes a method of operating a communication system in a vehicle. The vehicle includes a first safety belt securable around a vehicle occupant. The method includes: detecting, at a first microphone, a first acoustic input and, in response, determining that the first acoustic input corresponds to first audible speech at a speech time; detecting vibration associated with a speaking vehicle occupant at a vibration time using a vibration sensor associated with the first safety belt; determining that the vibration time substantially corresponds to the speech time to identify that the first audible speech originates from the vehicle occupant on which the first safety belt is secured about; and in response to identifying that the first audible speech originates from the vehicle occupant associated with the first safety belt, adjusting loudspeaker output of at least one loudspeaker.

In another aspect, the present application describes a communication system in a vehicle. The communication system includes a first safety belt having a vibration sensor for detecting vibrations from a vehicle occupant when the first safety belt is secured around the vehicle; a loudspeaker; a microphone; a processor coupled to the first safety belt, the loudspeaker, and the microphone; a memory coupled to the processor; and an aural manager including processor executable instructions. The processor executable instructions may be stored in the memory and, when executed, may cause the processor to: detect, at the microphone, a first acoustic input and, in response, determine that the first acoustic input corresponds to first audible speech at a speech time; detect vibration associated with a speaking vehicle occupant at a vibration time using a vibration sensor associated with the first safety belt; determine that the vibration time substantially corresponds to the speech time to identify that the first audible speech originates from the vehicle occupant on which the first safety belt is secured about; and in response to identifying that the first audible speech originates from the vehicle occupant associated with the first safety belt, adjust loudspeaker output of at least one loudspeaker.

In yet a further aspect, the present application describes non-transitory computer-readable storage medium storing processor-readable instructions that, when executed, configure a processor to perform one or more of the methods described herein. In this respect, the term processor is intended to include all types of processing circuits or chips capable of executing program instructions.

Other aspects and features of the present application will be understood by those of ordinary skill in the art from a review of the following description of examples in conjunction with the accompanying figures.

In the present application, the terms "about", "approximately", and "substantially" are meant to cover variations that may exist in the upper and lower limits of the ranges of values, such as variations in properties, parameters, and dimensions. In a non-limiting example, the terms "about", "approximately", and "substantially" may mean plus or minus 10 percent or less.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

Vehicle communication systems commonly focus on enhancing the aural experience of vehicle occupants. Such vehicle communication systems are focused on improving the integrity or fidelity of acoustic output within the vehicle cabin. However, in some scenarios, it may be desirable to detect acoustic input from vehicle occupants and, in response, decease loudspeaker output such that vehicle occupants can conduct hands-free operations via voice commands or such that the vehicle occupants can conduct conversations with other vehicle occupants.

Reference is made to FIG. 1, which illustrates, in block diagram form, a vehicle communication system 110 and a client device 180, in accordance with an example of the present application. The vehicle communication system 100 is installed within an example vehicle. In examples described herein, vehicles can be motor vehicles (e.g., automobiles, cars, trucks, buses, motorcycles, etc.), aircrafts (e.g., airplanes, drones, helicopters, etc.), spacecrafts (e.g., spaceplanes, space shuttles, space capsules, space stations, satellites, etc.), watercrafts (e.g., ships, boats, hovercrafts, submarines, etc.), railed vehicles (e.g., trains, trams, etc.), or other types of vehicles including any combinations of the foregoing.

The client device 180 can be a computing device having one or more processors, memory, and communication capabilities. In examples described herein, the remote device 180 is an electronic device. Electronic devices can be endpoints including one or more of any of the following: mobile devices (e.g., smartphones, tablets, phablets, laptops, wearables, gaming devices, navigation devices, etc.), computers (e.g., desktops, all-in-one computers, thin-client devices, etc.), IoT (Internet of Things) devices (e.g., vehicles, appliances, smart devices, connected devices, etc.), EoT (Enterprise of Things) devices (e.g., IoT devices in an enterprise), or any similar computing device or combination thereof.

In some examples, the client device 180 can be a mobile device configured to provide voice and/or video communication capability and can include processor-executable instructions for communicating, via a network 150, with the vehicle communication system 110. In some examples, one or more other client devices can be configured to communicate, via the network 150, with the vehicle communication system 110.

The network 150 can include a plurality of interconnected wired and wireless networks, including the Internet, wireless local area networks, wireless area networks, cellular networks, or the like. In some other examples, the communication subsystem includes a Bluetooth™ subsystem or other short-range communication subsystems for establishing communication channels with remote devices that are detected within proximity of the vehicle having the vehicle communication system 110.

The vehicle communication system includes one or more loudspeakers 120 (illustrated individually as 120*a*, 120*b*, 120*c*, . . . 120*n*). The loudspeakers 120 are electroacoustic transducer devices configured to convert electrical signals into sound waves or acoustic output. The vehicle communication system 110 includes one or more microphones 130 (illustrated individually as 130*a*, 130*b*, . . . , 130*n*). The microphones 130 are transducers configured to detect sound waves or acoustic input and to convert the detected sound waves into electrical signals.

The vehicle communication system 110 includes an aural manager 112. The aural manager 112 includes processor-executable instructions to configure the loudspeakers 120 and the microphones 130 for one or more aural operations. For example, the aural manager 112 can configure the loudspeakers 120 and the microphones 130 for hands-free communication operations, active noise control operations, in-car communication operations, or other operations described herein.

In some examples, respective loudspeaker configurations may be associated with one or more sets of loudspeaker output settings 114. Loudspeaker output settings 114 can include features such as acoustic bass settings, acoustic treble settings, fade settings (e.g., front/back speaker volume balance), balance settings (e.g., left/right speaker volume balance), output volume settings, or other parameters that can control characteristics of acoustic output from the one or more loudspeakers. In some examples, loudspeaker output settings 114 are applied to individual loudspeakers, respectively, where in some other examples, loudspeaker output settings 114 are applied to a plurality of loudspeakers as a group such that the combination of the loudspeakers provide a combined acoustic output.

The vehicle communication system 110 can include a user interface 140 configured to accept input from a vehicle occupant or to provide audible or visual output to the vehicle occupant relating to operations of the aural manager 112. In some examples, the vehicle communication system 110 can include a location unit configured, for example, to ascertain real-time or near-real time geographical location details of the vehicle.

In some examples, the vehicle communication system 110 configures the loudspeakers 120 and the microphones 130 for hands-free communication. For example, when the vehicle occupant associated with a mobile telephonic device (e.g., cellular telephone or smartphone) is proximal to the vehicle, a wireless communication link, such as a Bluetooth™ communication link, may be formed between the mobile telephonic device and the vehicle communication system 110. The vehicle communication system 110 can configure one or more loudspeakers 120 or one or more microphones 130 to operate as an extension of the microphone and loudspeaker of the mobile telephonic device, allowing the vehicle operator to conduct voice communication using the loudspeakers 120 and the microphones 130 and without handling the mobile telephonic device. Such configuration of the loudspeakers 120 and the microphones 130 for hands-free communication relieves a vehicle occupant from needing to handle the mobile telephonic device. The vehicle occupant can conduct a hands-free telephonic conversation from the vehicle communication system 110, via the network 150, with another party who is remote to the vehicle and who is using the client device 180.

In some examples, the vehicle communication system 110 configures the loudspeakers 120 and the microphones 130 for enhancing in-vehicle communications among two or more vehicle occupants. One or more microphones 130 are positioned about the vehicle for detecting audible speech from vehicle occupants or for detecting other acoustic input. The vehicle communication system 110 may be configured to enhance audible speech, dampen potentially objectionable noise from the engine or from the environment external to the vehicle, and provide audible speech output corresponding to respective vehicle occupants to the other vehicle occupants on one or more loudspeakers 120 positioned proximal to the other vehicle occupants.

To provide audible speech (e.g., detected at a microphone) from one vehicle occupant to other vehicle occupants (e.g., on one or more loudspeakers), the vehicle communication system 110 can identify an acoustic zone origin of the acoustic speech input. For example, the vehicle communication system 110 may detect acoustic speech input, via a microphone 120, and identify that the acoustic speech input originated, for example, from a region proximal to the driver's seat. In some examples, the vehicle communication system 110 can conduct sound analysis for deducing the likely acoustic zone origin of acoustic input. Continuing with the example of FIG. 1, if each of the microphones are positioned proximal to an acoustic zone within the vehicle, when the vehicle communication system 110 detects acoustic input, the vehicle communication system 110 may receive an acoustic signal (e.g., corresponding to the detected acoustic input) from each of the plurality of microphones, compare the respective signal strengths of the received acoustic signal, and determine that the microphone that captured the acoustic signal with greatest relative signal strength is associated with the acoustic zone from which the acoustic input originated. Subsequently, that acoustic signal may be provided as acoustic output at the plurality of loudspeakers associated with acoustic zones adjacent the acoustic zone of the vehicle driver.

When a vehicle is in motion (e.g., along a road), road noise or wind can interrupt intra-vehicle communications among vehicle occupants. Continuing with the example above, prior to transmitting the acoustic signal to the plurality of loudspeakers for providing acoustic output at the loudspeakers, in some examples, the vehicle communication system 110 can detect whether one or more vehicle windows are in an open position. When the vehicle communication system 110 detects that one or more vehicle windows are in an open position, the vehicle communication system 110 can adjust loudspeaker output by increasing output volume at respective loudspeakers of acoustic zones. The aforementioned description is an example and other methods for determining the acoustic input origin of an acoustic signal within a vehicle and providing loudspeaker output can be contemplated.

When the vehicle communication system 110 is configured for enhancing in-vehicle communications, vehicle occupants in a front portion of the vehicle need not raise their voices when communicating with vehicle occupants in a rear portion of the vehicle. Such configuration of the loudspeakers 120 and the microphones 130 aims to enhance the aural experience of vehicle occupants, including excluding acoustics originating from outside the vehicle occupant cabin.

The foregoing example depends, at least in part, on methods for detecting acoustic input and, in response, determining that the acoustic input corresponds to audible speech. However, in some scenarios, the aforementioned method of detecting acoustic input can provide false positive identification of acoustic speech. For example, when the vehicle communication system 110 is configured to provide acoustic output having 'vocals' at the loudspeakers, the above described method of detecting acoustic input can provide false positive identification of acoustic speech and unintentionally promulgate features of the vehicle communication system 110. Acoustic output having 'vocals' can include music or talk radio.

In some examples, the vehicle communication system 110 is configured to deconstruct acoustic signals transmitted to loudspeakers to detect or identify vocals and to distinguish vocals from non-vocal acoustic content. When the vehicle communication system 110 detects vocals in the deconstructed acoustic signals, the vehicle communication system 110 can determine that the vocals being outputted on the loudspeakers is not audible speech originating from a vehicle occupant and can refrain from adjusting loudspeaker output.

Some of the examples described above can require that the vehicle communication system 110 conduct acoustic signal analysis. In one example described above, the vehicle communication system 110 detects acoustic input at a microphone for determining whether the acoustic input corresponds to audible speech from a vehicle occupant. In another example described above, the vehicle communication system 110 detects and deconstructs acoustic signals being transmitted to loudspeakers for identifying vocals to be outputted on one or more loudspeakers. While the vehicle communication system 110 can perform analysis of acoustic signals transmitted to loudspeakers or perform analysis of acoustic input detected at a microphone, it may be desirable to identify acoustic input origin, such as from which acoustic zone the acoustic input originated from, based on additional system inputs.

In FIG. 1, the vehicle communication system 110 includes one or more safety belts 150 (illustrated individually as 150*a*, 150*b*, 150*c*, . . . , 150*n*). Safety belts 150 are safety devices for securing a vehicle occupant within the vehicle to minimize movement of the vehicle occupant in the event of a vehicle collision. In many countries or regions, vehicle occupants are required by laws or regulations to wear a safety belt while the vehicle is in operation or motion.

In some examples, the safety belt 150 can include a vibration sensor affixed thereto and in communication with the vehicle communication system 110. The vibration sensor can be any electrical or mechanical device configured to detect vibrational movement. For instance, the vibration sensor can be a displacement sensor, a velocity sensor, accelerometers, or any other type of sensor for measuring vibrational movement. The vibration sensor described herein may be positioned on respective safety belts 150 for detecting chest or diaphragm vibrations of a vehicle occupant when the vehicle occupant is speaking. In some examples, the vibration sensor may be positioned on the safety belt 150 such that the vibration sensor is proximal to the torso of the vehicle occupant when the safety belt 150 is secured around the vehicle occupant.

In some examples, the processor may identify vibrations using a vibration sensor that registers vibrations having an amplitude greater than a voice threshold for detecting chest vibration during audible speech from the vehicle occupant. Because the vibration sensor can detect vibrations of varying magnitude and because a variety of physiological factors can cause a vehicle occupant to generate vibrations (e.g., heartbeat, shivering due to environmental conditions, vocal cord movement when speaking, etc.), the processor may identify vibrations using a vibration sensor when detected vibrations have a threshold amplitude or other vibration characteristics that correlate to a person speaking.

As will be described herein, in some examples, the vehicle communication system 110 includes processor-executable instructions that, when executed, cause a processor to detect, at a microphone 130, an acoustic input and, in response, determine that the acoustic input corresponds to audible speech at a speech time. Further, the processor can detect vibration associated with a speaking vehicle occupant at a vibration time using a vibration sensor associated with a safety belt 150. The processor can determine that the vibration time substantially corresponds to the speech time to identify that the audible speech originates from the acoustic zone that is associated with that safety belt 150.

Figure 2:
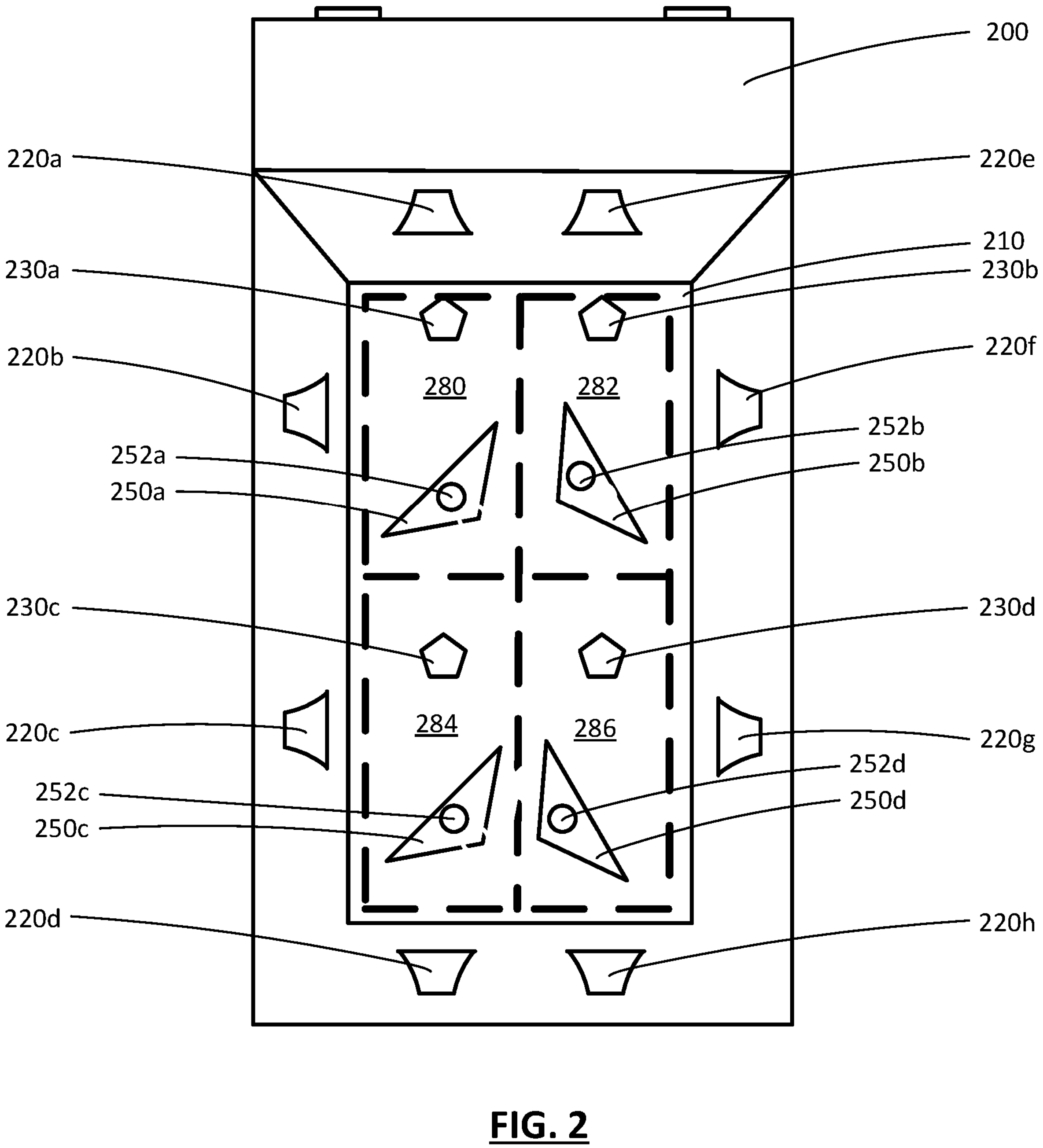
FIG. 2 illustrates a top sectional view of a vehicle having the vehicle communication system 100 of FIG. 1 installed therein, in accordance with an example of the present application.

Reference is now made to FIG. 2, which illustrates a top sectional view of a vehicle 200 having the vehicle communication system 110 of FIG. 1 installed therein, in accordance with an example of the present application.

In FIG. 2, a plurality of loudspeakers are installed about the vehicle 200. The loudspeakers are illustrated as a first loudspeaker 220*a*, a second loudspeaker 220*b*, a third loudspeaker 220*c*, a fourth loudspeaker 220*d*, a fifth loudspeaker

220*e*, a sixth loudspeaker 220*f*, a seventh loudspeaker 220*g*, and an eighth loudspeaker 220*h*. Eight discrete loudspeakers are illustrated in FIG. 2; however, any number of loudspeakers may be included in the vehicle 200. The loudspeakers are illustrated to be positioned about a perimeter of the vehicle occupant cabin; however, in some examples, the loudspeakers can be installed at locations inward of the perimeter of the vehicle occupant cabin 210.

The vehicle occupant cabin 210 can include one or more defined acoustic zones. In the example of FIG. 2, the vehicle 200 includes a first acoustic zone 280, a second acoustic zone 282, a third acoustic zone 284, and a fourth acoustic zone 286. The first acoustic zone 280 corresponds to the volume of space proximal to the vehicle driver seat. The second acoustic zone 282 corresponds to the volume of space proximal to a front passenger seat. The third acoustic zone 284 corresponds to the volume of space proximal to the rear left passenger seat. The fourth acoustic zone 286 corresponds to the volume of space proximal to the rear right passenger seat. Four acoustic zones are illustrated in FIG. 2; however, any number of acoustic zones or other configurations of acoustic zones within the vehicle occupant cabin 210 can be contemplated. That is, in some examples (not illustrated in FIG. 2), the rear portion of the vehicle occupant cabin can include three passenger seats and a single rear acoustic zone can be designated for the three passenger seats or three discrete rear acoustic zones can be designated for respective rear passenger seats.

Referring still to FIG. 2, loudspeakers can be associated with particular acoustic zones. For example, the first loudspeaker 220*a* and the second loudspeaker 220*b* can be associated with the first acoustic zone 280. The vehicle communication system 110 (FIG. 1) can be configured to provide particular acoustic output on the first loudspeaker 220*a* and the second loudspeaker 220*b* that may be different than that for other loudspeakers or that may be separately processed for the vehicle occupant in the first acoustic zone 280. For example, during a hands-free cellular voice communication call with the remote device 180, acoustic output corresponding to the voice communication call can be amplified for output on the first loudspeaker 220 and the second loudspeaker 220*b*, while limited acoustic output is provided by the remaining loudspeakers.

As illustrated in FIG. 2, the fifth loudspeaker 220*e* and the sixth loudspeaker 220*f* are associated with the second acoustic zone 282. The third loudspeaker 220*c* and the fourth loudspeaker 220*d* are associated with the third acoustic zone 284. The seventh loudspeaker 220*g* and the eighth loudspeaker 220*h* are associated with the fourth acoustic zone 286.

In FIG. 2, a plurality of microphones are installed about the vehicle. For example, a first microphone 230*a* is installed proximal to the first acoustic zone 280 for detecting and receiving acoustic input. Due in part to proximal location, acoustic speech from the vehicle driver may be best detected by the first microphone 230*a*. Similarly, a second microphone 230*b* is installed proximal to the second acoustic zone 282 and may best detect acoustic speech from the front passenger. A third microphone 230*c* is installed proximal to the third acoustic zone 284 and may best detect acoustic speech from the rear left passenger. A fourth microphone 230*d* is installed proximal to the fourth acoustic zone 286 and may best detect acoustic speech from the rear right passenger.

The above description notes that particular microphones may best detect acoustic speech from particular passengers on the basis that that respective passenger may be geographically nearest to that particular microphone. However, it can be appreciated that, for example, the first microphone 230*a* could detect acoustic input from the rear right passenger located in the fourth acoustic zone 286 albeit to a reduced degree. For example, the acoustic signal generated by the first microphone 230*a* and corresponding to acoustic input from the rear right passenger may have a reduced acoustic signal amplitude and be less optimal for signal processing operations.

Further, the respective acoustic zones in FIG. 2 are associated with and include one or more safety belts securable around a vehicle occupant. For example, the first acoustic zone 280 includes a first safety belt 250*a* having a first vibration sensor 252*a* positioned thereon such that the vibration sensor may detect chest or torso vibrations, for example, if a vehicle occupant when the vehicle occupant is speaking. Similarly, the second acoustic zone 282 includes a second safety belt 250*b* having a second vibration sensor 252*b* positioned thereon, the third acoustic zone 284 includes a third safety belt 250*c* having a third vibration sensor 252*c* positioned thereon, and the fourth acoustic zone 286 includes a fourth safety belt 250*d* having a fourth vibration sensor 252*d* positioned thereon. The above example describes safety belts including a single vibration sensor for detecting chest or torso vibrations that are indicative of a vehicle occupant speaking; however, example safety belts may include two or more vibration sensors positioned across the respective safety belts such that, irrespective of the vehicle occupant body size or height, at least one vibration sensor may be proximal to a vehicle occupant chest or torso.

In some examples, the occupant seats, such as the vehicle driver seat, the front passenger seat, or the rear passenger seats, can respectively include a seat vibration sensor for detecting vibrations from the vehicle occupant when a vehicle occupant is seated. The respective seat vibration sensors can be positioned proximal to an upper seat back region of the occupant seat. When the vehicle occupant is seated in the occupant seat, the vehicle occupant's back can rest on the upper seat back region. When the vehicle occupant speaks out loud, the seat vibration sensor can detect back or torso vibrations that are associated with the vehicle occupant speaking at a vibration time. As will be described herein, when the detected back or torso vibration at the vibration time corresponds to the speech time of detected audible speech from the vehicle occupant, the vehicle communication system 110 can adjust loudspeaker output of at least one loudspeaker. In the vehicle communication system 110 examples described above, the system can include the one or more seat vibration sensors for supplementing the vibration sensors positioned on respective safety belts. Alternatively, the one or more seat vibration sensors can replace the vibration sensors positioned on respective safety belts for detecting vibration associated with the speaking vehicle occupant.

In some examples, one or more microphones can be positioned on a respective safety belt for detecting acoustic input. That is, the microphone positioned on a respective safety belt can be affixed and directed for detecting acoustic input from a vehicle occupant when a safety belt is secured around the vehicle occupant.

As described herein, it is desirable to minimize false positive identification of acoustic speech that may, in fact, originate from audio content being played back on the vehicle loudspeakers. Further, it is desirable to determine or validate acoustic zone origin of detected acoustic speech with increased accuracy. Such improved vehicle communication systems and methods of operating vehicle communication systems are now provided.

Figure 3:
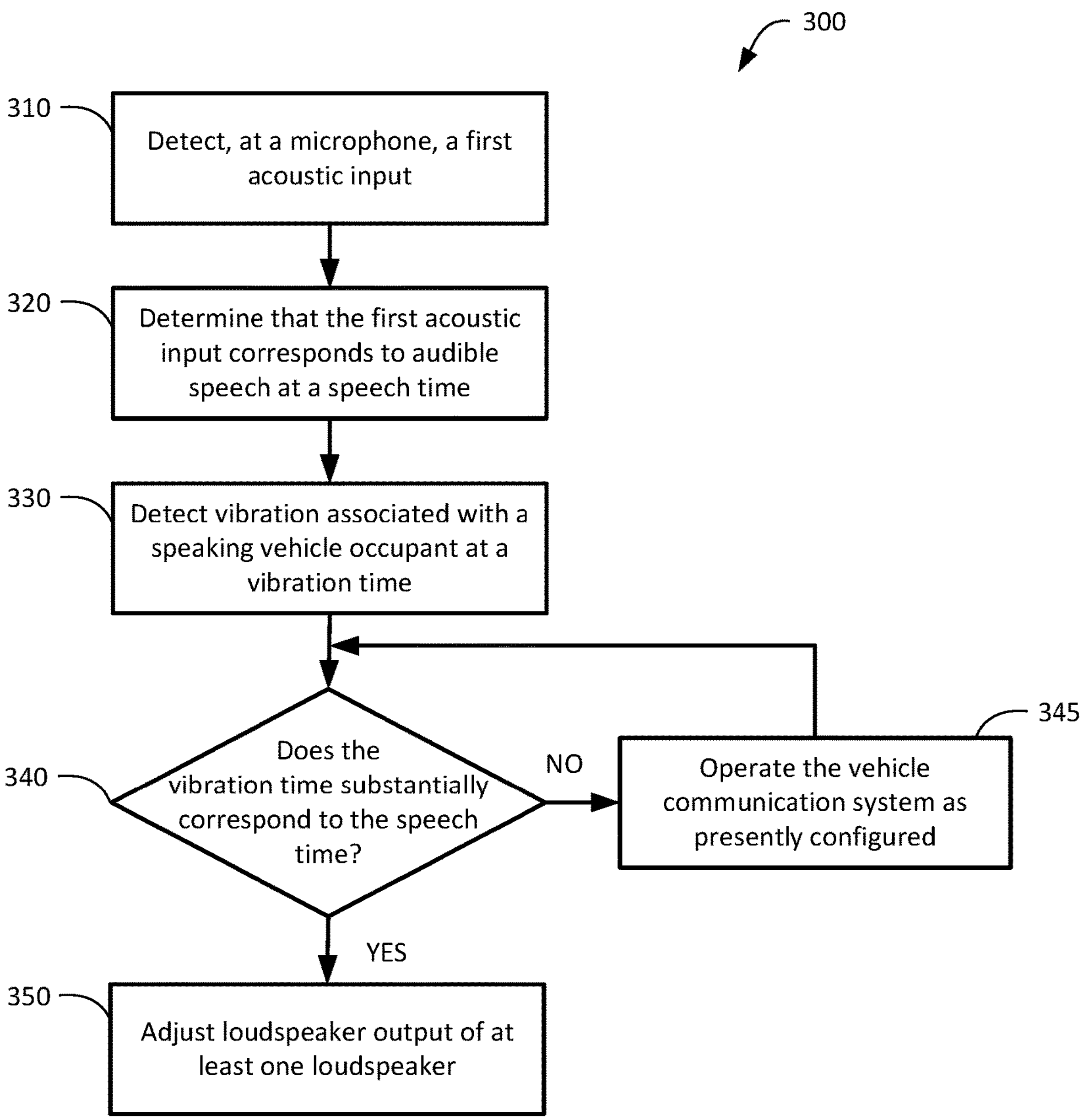
FIG. 3 illustrates, in flowchart form, a method of operating a vehicle communication system, in accordance with an example of the present application.

Reference is made to FIG. 3, which illustrates, in flowchart form, a method 300 of operating a vehicle communication system 110 (FIG. 1) in a vehicle 200 (FIG. 2), in accordance with an example of the present application. The method 300 includes operations that are carried out by one or more processors of the vehicle communication system 110. The method 300 may be implemented, at least in part, through processor-executable instructions associated with the aural manager 112 (FIG. 1). In some examples, one or more of the operations may be implemented via processor-executable instructions in other applications or in an operating system stored and executed in memory of the vehicle communication system 110. As described, the vehicle communication system 110 may be installed in a vehicle having a plurality of acoustic zones (such as 280, 282, 284, 286 of FIG. 2). The respective acoustic zones are associated with one or more loudspeakers 120 (FIG. 1). Further, each respective acoustic zones include a safety belt 150 securable around a vehicle occupant.

At operation 310, the processor detects, at a microphone, a first acoustic input. The microphone can be any of the microphones illustrated in FIG. 2. For example, a vehicle driver may be a vehicle occupant in the first acoustic zone 280 and may speak out loud. The first microphone 230*a* may receive acoustic input from the vehicle driver and convert the sound waves of the acoustic input into an acoustic signal. Note that any of the second microphone 230*b*, third microphone 230*c*, or fourth microphone 230*d* may also receive acoustic input from the vehicle driver and convert the sound waves of the acoustic input into an acoustic signal for detection by the vehicle communication system. It can be appreciated that, in some scenarios, the acoustic signal corresponding to the acoustic input and generated by the first microphone 230*a* may be a more accurate representation of the acoustic input at least because the vehicle driver is nearer to the first microphone 230*a* than any other microphone. The acoustic signal generated by the other microphones may include acoustic input from other vehicle occupants or ambient environment.

At operation 320, the processor determines that the first acoustic input corresponds to audible speech at a speech time. The processor may assign a speech time as a time stamp. For example, the time stamp may identify when the detected audible speech occurred. The time stamp can be generated with reference to a reference clock of the vehicle communication system. As will be described herein, the assigned speech time can be used for correlating the identified audible speech to other system inputs for: (i) validating that the determined audible speech originates from a vehicle occupant, rather than from other sources such as the loudspeaker output; or (ii) identifying the acoustic zone origin of the determined audible speech (e.g., whether the detected audible speech was spoken by a vehicle occupant in the first acoustic zone 280, the second acoustic zone 282, the third acoustic zone 284, or the fourth acoustic zone 284).

In some examples, the processor determines that the first acoustic input corresponds to audible speech by using a speech recognition engine to identify that the first acoustic input is an utterance that is audible speech. The audible speech may be speech in one or more languages. That is, the speech recognition engine may determine whether the acoustic input at the respective microphones is speech or whether the acoustic input at the respective microphones may be ambient noise or other non-speech input. Other methods of identifying audible speech from acoustic input can be contemplated.

At operation 330, the processor detects vibration associated with a speaking occupant at a vibration time using a vibration sensor associated with a first safety belt. Referring again to FIG. 2 as an example, when the vehicle driver (e.g., a first vehicle occupant) is sitting in the first acoustic zone 280, the vehicle driver may secure the first safety belt 250*a* around at least a portion of the vehicle driver. Once the first safety belt 250*a* is secured around the vehicle driver, the first vibration sensor 252*a* may be positioned about the chest or torso of the vehicle driver for detecting chest or torso vibrations when the vehicle driver may be speaking.

Further, the processor may also assign a vibration time as a time stamp. This time stamp may identify when the detected vibration occurred. The time stamp can be generated with reference to a reference clock of the vehicle communication system. The detected vibration can be a proxy for determining whether the vehicle occupant may be speaking. For example, when a person speaks, movement of vocal cords or movement of air into or out of lungs may cause vibrations about the torso or chest of a person. Thus, a vehicle occupant speaking can be correlated to sensed vibrations about the vehicle occupant's chest or torso. However, detection of vibrations about the vehicle occupant's chest or torso may not necessarily mean that the vehicle occupant is speaking. Other physiological movements may also cause vibrations about the vehicle occupant's chest or torso. Thus, it may be desirable to correlate detected acoustic input, at a microphone, with detected vibrations using a vibration sensor associated with a safety belt for identifying vehicle occupant speech.

At operation 340, the processor determines whether the vibration time substantially corresponds to the speech time. Continuing with the above example, if the vibration time included a time stamp with value t=5 and the speech time included another time stamp with value t=7, the processor may determine that the vibration time does not substantially correspond to the speech time. When the processor determines that the vibration time does not substantially correspond to the speech time, at operation 345, the processor continues operating the vehicle communication system as presently configured. In the scenario where the vibration time does not substantially correspond to the speech time, the detected audible speech have been provided by loudspeaker output or the detected vibration may have been caused by other physiological functions not related to vocal speech of the vehicle occupant (e.g., increased heart rate, etc.).

In another example, however, if the vibration time included a time stamp with value t=5 and the speech time included another time stamp value t=5.1, the processor may determine that the vibration time substantially corresponds to the speech time to identify that the audible speech originates from the vehicle occupant on which the first safety belt 250*a* is secured about. That is, the identified audible speech originates from the vehicle occupant in the first acoustic zone 280.

At operation 350, the processor adjusts loudspeaker output of at least one loudspeaker. In FIG. 2, the processor may adjust loudspeaker output of the first loudspeaker 220*a* and the second loudspeaker 220*b*. In some examples, adjusting loudspeaker output of the at least one loudspeaker in the first acoustic zone 280 includes decrementing loudspeaker output volume. That is, the processor may decrement loudspeaker output volume for the first loudspeaker 220*a* and the second loudspeaker 220*b*, such that the loudspeaker output volume for the first loudspeaker 220*a* and the second loudspeaker 220*b* is lower than the loudspeaker output volume for the remaining loudspeakers in the vehicle 200.

Figure 4:
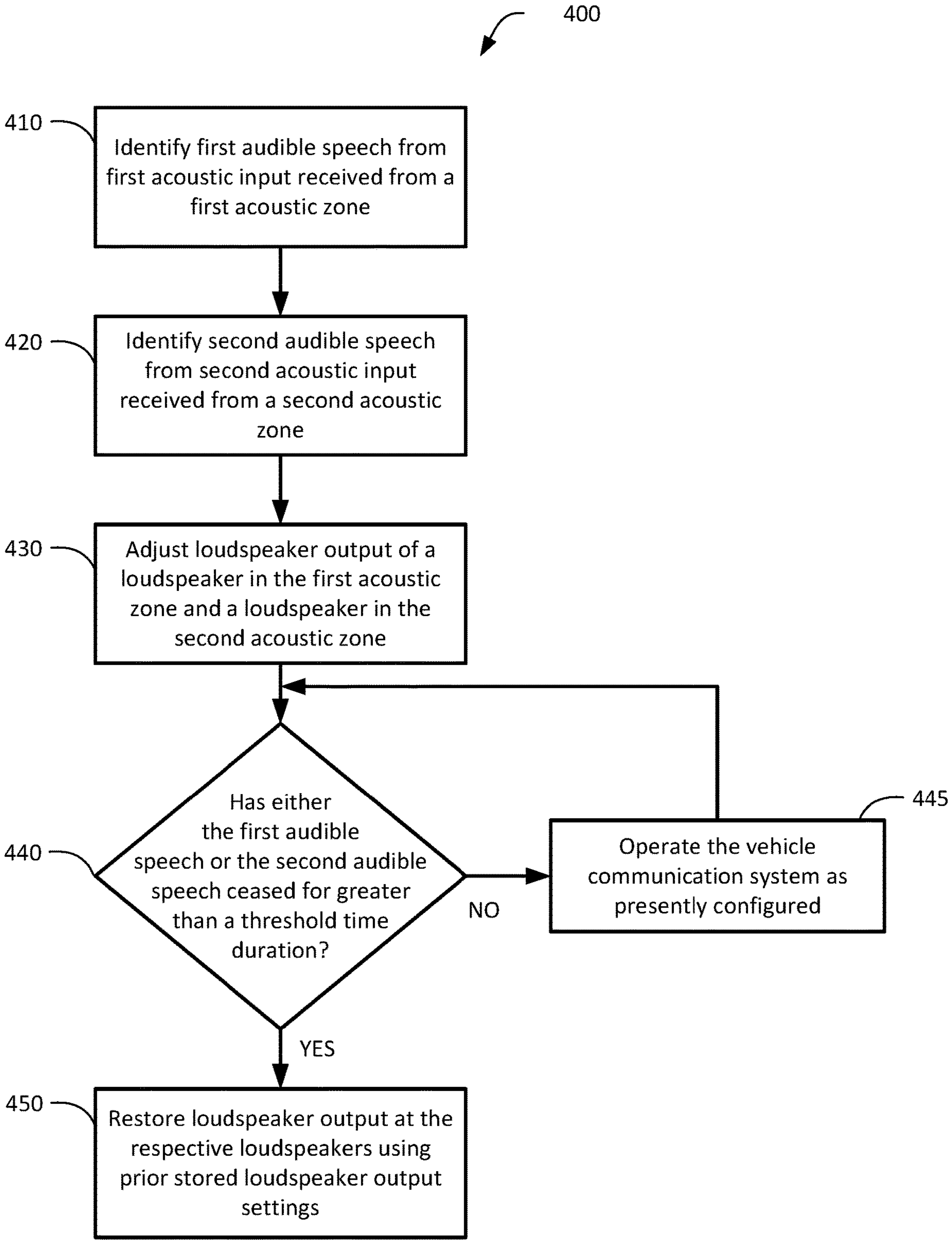
FIG. 4 illustrates, in flowchart form, a method of operating a vehicle communication system, in accordance with another example of the present application.

Reference is made to FIG. 4, which illustrates, in flowchart form, a method 400 of operating the vehicle communication system 110 (FIG. 1) in a vehicle 200 (FIG. 2), in accordance with another example of the present application. The method 400 includes operations that are carried out by one or more processors of the vehicle communication system 110. The method 400 may be implemented, at least in part, through processor-executable instructions associated with the aural manager 112 (FIG. 1). In some examples, one or more of the operations may be implemented via processor-executable instructions in other applications or in an operating system stored and executed in memory of the vehicle communication system 110.

At operation 410, the processor identifies first audible speech from first acoustic input received from the first acoustic zone 280 (FIG. 2). The processor may identify first audible speech by operations similar to operation 320 (FIG. 3). As described, the acoustic zone origin of the first audible speech may be the first acoustic zone 280 based at least on correlating the assigned speech time for the audible speech and the assigned vibration time for the detected vibration. Thus, the processor may identify first audible speech from the vehicle driver in the first acoustic zone 280 based on operations similar to operations 310, 320, and 330 of FIG. 3.

At operation 420, the processor identifies second audible speech from second acoustic input received from a second acoustic zone. For example, the processor may identify second audible speech by detecting, at a microphone, a second acoustic input and, in response, determining that the second acoustic input corresponds to audible speech at a second speech time.

Continuing with the example illustrated in FIG. 2, the second audible speech can be detected as the second acoustic input from a vehicle occupant in the fourth acoustic zone 286 (e.g., right rear passenger of vehicle 200). The second acoustic input can be detected by the fourth microphone 230*d*; however, the second acoustic input can also be detected by the first microphone 230*a* or any other microphone in the vehicle. In some examples, the vehicle may include one microphone for detecting acoustic input from any of the vehicle acoustic zones. When the processor determines that the second acoustic input corresponds to second audible speech, the processor assigns a second speech time as a time stamp. Similar to the examples described herein, the time stamp identifies when the detected audible speech occurred.

Further, the processor detects vibration associated with the vehicle occupant in the fourth acoustic zone 286 at a second vibration time using a fourth vibration sensor 252*d* associated with the fourth safety belt 250*d*. As an example, the processor can assign a speech time value t=7.2 to the second audible speech and can assign a vibration time value t=7 to the detected vibration associated with the vehicle occupant in the fourth acoustic zone 286. Thus, subsequent to operation 410 and 420 described above, the processor identifies first audible speech correlated to the vehicle driver positioned in the first acoustic zone 280 and second audible speech correlated to the second vehicle occupant positioned in the fourth acoustic zone 286.

Based on the above described example, the vehicle communication system can identify, using both detected acoustic input and detected vibrations using vibration sensors associated with safety belts located at known locations or in known respective acoustic zones, respective acoustic zone origins of detected acoustic input or acoustic speech. That is, by correlating acoustic speech time and vibration times, the processor can minimize false positive identification of acoustic speech that may originate from loudspeaker output (e.g., talk radio).

At operation 430, the processor adjusts loudspeaker output of at least one loudspeaker in the first acoustic zone and a second loudspeaker in the second acoustic zone. That is, continuing with the example described above, the processor adjusts loudspeaker output of the first loudspeaker 230*a* or the second loudspeaker 230*b* that is proximal to the first acoustic zone 280. The processor also adjusts loudspeaker output of the seventh loudspeaker 220*g* or the eighth loudspeaker 220*h* that is proximal to the fourth acoustic zone 280. In one example, the processor can adjust loudspeaker output by decrementing loudspeaker output volume. Continuing with the above described example, the processor can: (i) decrement the loudspeaker output volume for the first loudspeaker 220*a* and the second loudspeaker 220*b* associated with the first acoustic zone 280 and (ii) can decrement the loudspeaker output volume for the seventh loudspeaker 220*g* and the eighth loudspeaker 220*h* associated with the fourth acoustic zone 286 while maintaining the loudspeaker output volume levels for the remaining loudspeakers illustrated in FIG. 2.

The selective adjustments to loudspeaker output levels can create target audio zones for respective vehicle occupants when multiple occupants may be within the vehicle cabin 210 (FIG. 2). For example, by adjusting the loudspeaker output volume for loudspeakers associated with the first acoustic zone 280 and the fourth acoustic zone 286, the vehicle driver (e.g. in the first acoustic zone 280) and the right rear vehicle occupant (e.g., in the fourth acoustic zone 286) can conduct an intra-vehicle conversation without having to raise respective voices. That is, the operations of the vehicle communication system: detects acoustic speech from both the vehicle driver and the right rear vehicle occupant and automatically adjusts loudspeaker output levels for the loudspeakers proximal to the vehicle driver and the right rear vehicle occupant such that the respective occupants can hear one another. Further, other vehicle occupants who may be in the second acoustic zone 282 or the third acoustic zone 284 may continue consuming acoustic output provided on the loudspeakers associated with the second acoustic zone 282 and the fourth acoustic zone 284, respectively.

At operation 440, the processor determines whether the audible speech is detected in less than two acoustic zones for greater than a threshold time. Continuing with the above example, the processor determines whether the first audible speech from the first acoustic zone 280 or the second audible speech from the fourth acoustic zone has ceased for greater than a threshold time. The processor can determine that audible speech has ceased when the processor determines that the acoustic input at one or more microphones lack linguistic characteristics of one or more languages.

When the processor determines that audible speech continues to be detected in both the first acoustic zone 280 and the fourth acoustic zone 286 (e.g., the vehicle driver and the right rear vehicle occupant continues to engage in a conversation), at operation 445, the processor operates the vehicle communication system as presently configured. As described, at operation 430, the processor had adjusted loudspeaker output levels for loudspeakers associated with the first acoustic zone 280 and the fourth acoustic zone 286.

Thus, when audible speech continues to be detected in the aforementioned acoustic zones, at operation 445, the processor operates the vehicle communication system as presently configured (e.g., as was configured at operation 430.

When the processor no longer detects audible speech in both the first acoustic zone 280 and the fourth acoustic zone 286, the processor may determine whether audible speech is no longer detectible in one or both of the first acoustic zone 280 and the fourth acoustic zone 286 for longer than a threshold time. For example, the threshold time can be 5 seconds and the processor can determine whether audible speech is no longer detectable in both the acoustic zones for greater than 5 seconds. The threshold time of 5 seconds is an example and any other threshold time can be contemplated. In some examples, when audible speech is detected in a single acoustic zone, the vehicle occupant in that single acoustic zone may not be speaking to another vehicle occupant and may, for example, be singing aloud to the radio or may be practicing a presentation speech. Thus, in some examples, the vehicle communication system may only adjust loudspeaker output when audible speech is detected in two or more acoustic zones.

When the processor determines that audible speech is detected in less than two acoustic zones for greater than the threshold time, at operation 450, the processor restores loudspeaker output at the respective loudspeakers using prior stored loudspeaker output settings. For example, prior to the processor adjusting loudspeaker output at operation 430, the processor can store primary loudspeaker output settings, such as baseline or default settings. At operation 450, the processor can restore loudspeaker output using the baseline or default settings. The baseline or default settings can correspond to loudspeaker volume settings, acoustic bass settings, acoustic treble settings, balance settings, or other settings affecting the loudspeaker output.

In some examples, it can be desirable to refrain from adjusting loudspeaker output of at least one loudspeaker if one or more vehicle occupants are singing aloud in a vehicle karaoke session. For instance, the vehicle driver in the first acoustic zone 280 and the occupant in the fourth acoustic zone 286 can be singing out loud to music being played back on the vehicle loudspeakers. In the example methods described above, the vehicle communication system 110 is configured to decrease loudspeaker output volume for the loudspeakers in the first acoustic zone 280 and the fourth acoustic zone 286 (see e.g., description of operation 430 described above). To refrain from disrupting a lively vehicle karaoke session, the vehicle communication system 110 is, in some examples, configured to determine whether timing of detected acoustic input at a microphone corresponds to timing of vocals detected in the acoustic output (e.g., music with vocals) being played back on the vehicle loudspeakers. When the vehicle communication system 110 determines that the timing of detected acoustic input at a microphone (e.g., singing in an acoustic zone) substantially corresponds to the timing of vocals detected in the acoustic output being played back on the vehicle loudspeakers, the vehicle communication system 110 can be configured to refrain from adjusting the loudspeaker output.

Based on the above description and examples, the example vehicle communication systems and methods of operating vehicle communication systems can adaptively adjust loudspeaker output in response to detecting acoustic speech from one or more of the vehicle occupants. To minimize inadvertent adjustments to loudspeaker output based on acoustic speech that may be provided at loudspeaker output (e.g., talk radio) that is not acoustic speech from vehicle occupants, the vehicle communication system includes vibration sensors associated with safety belts within the vehicle. As illustrated in examples described herein, the processor can identify acoustic speech from vehicle occupants by correlating time stamps, for example, of detected acoustic speech and detected vibrations from vibration sensors proximal or adjacent to vehicle occupants. When time stamps from vibration times and speech times are not substantially similar, the processor can disregard the detected audible speech and override any operations to adjust loudspeaker output that may be meant to facilitate in-vehicle conversations or communications. Operation of the example vehicle communication systems and methods described herein are dependent on vehicle occupants securing safety belts around themselves while in the vehicle. If vehicle occupants fail to secure safety belts around themselves while in the vehicle, the processor may determine that any determined speech time stamp will not substantially correspond with determined vibration times. That is, if safety belts are not secured around vehicle occupants, the vibration sensors may not detect any appreciable vibrations, and the processor may not generate any vibration time stamps.

Referring again to the method 300 of FIG. 3, in some examples, prior to adjusting loudspeaker output of the at least one loudspeaker (e.g., operation 350), the processor can determine that a telephonic call originating from a client device 180 (FIG. 1) external to the vehicle is in communication with the communication system.

In response to determining that an active telephonic call is occurring between the client device 180 and the vehicle communication system 110, the processor can reduce loudspeaker output of at least one loudspeaker in the first acoustic zone for the duration of the detected telephonic call. For example, a vehicle driver may be seated in the first acoustic zone 280 (FIG. 2) and the processor may receive acoustic input at a microphone, may determine that the acoustic input is audible speech at a speech time, and may detect vibration associated with the speaking vehicle driver at a vibration time using a first vibration sensor **252*a* associated with the first safety belt 250*a* (FIG. 2). The processor can determine that the vibration time substantially corresponds to the speech time to identify that the audible speech originates from the first acoustic zone 280 associated with the first safety belt 250*a* and reduce the loudspeaker output of the first loudspeaker 220*a* or the second loudspeaker 220*b* in the first acoustic zone 280** for the duration of the detected telephone call.

In the above described example, by detecting that an active telephonic call connection is made and by determining that audible speech originates from the first acoustic zone 280 for reducing loudspeaker output of associated loudspeakers, the vehicle driver can conduct a telephone conversation with a remote party (e.g., party using client device 180) with minimal acoustic interference or distraction from loudspeaker output at loudspeakers within the vehicle. Based on the example above-described operations, the processor may automatically reduce loudspeaker output in the targeted acoustic zone without requiring manual input from the vehicle occupant/vehicle driver.

In some scenarios, the telephonic call can be conducted by other vehicle occupants, such as a vehicle occupant in the fourth acoustic zone 286. When the telephonic call is conducted by the occupant in the fourth acoustic zone 286, the processor may determine, based on operations described herein for detecting acoustic input and vibrations, that audible speech originates from the fourth acoustic zone 286 and the processor can adjust loudspeaker output of the seventh loudspeaker 220*g* and the eighth loudspeaker 220*h* (FIG. 2).

In some examples described herein, the processor can adjust loudspeaker output levels on a loudspeaker-by-loudspeaker basis. That is, the processor of the vehicle communication system can adjust loudspeaker output levels of one loudspeaker independently of another loudspeaker. In some examples, the processor can adjust loudspeaker output levels of respective loudspeakers based on relative loudspeaker output levels of adjacent loudspeakers as a group. For example, to reduce the loudspeaker output volume for loudspeakers associated with the first acoustic zone 280 (FIG. 2), the vehicle communication system can adjust loudspeaker balance among a plurality of loudspeakers about the vehicle interior to: (a) reduce loudspeaker output in the first acoustic zone 280; and (b) maintain loudspeaker output in the other acoustic zones. For example, the processor can bias loudspeaker output to loudspeakers generally positioned towards the right side of the vehicle and towards the rear of the vehicle.

Figure 5:
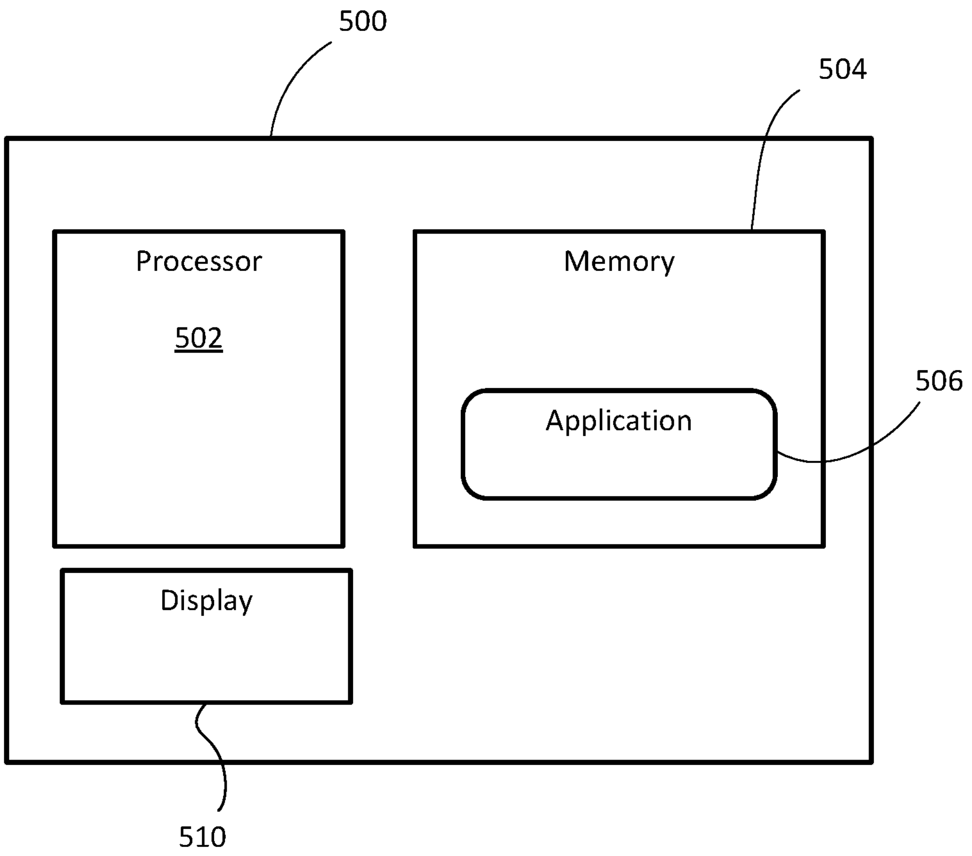
FIG. 5 illustrates a simplified block diagram of a vehicle communication system, in accordance with an example of the present application.

Reference is made to FIG. 5, which illustrates a simplified block diagram of a vehicle communication system, in accordance with an example of the present application. The vehicle communication system 500 includes one or more processors 502 and memory 504. The memory 504 stores processor-executable software, such as an aural manager application 506 containing instructions implementing the operations and functions of the vehicle communication system described herein. The vehicle communication system 500 also includes a display interface 510 or a display for providing visual output to a vehicle occupant. Further, the vehicle communication system 500 includes one or more loudspeakers or one or more microphones (not illustrated), similar to the vehicle communication system 110 of FIG. 1. The vehicle communication system 500 also includes one or more vibration sensors (not illustrated) associated with respective safety belts (not illustrated).

Figure 6:
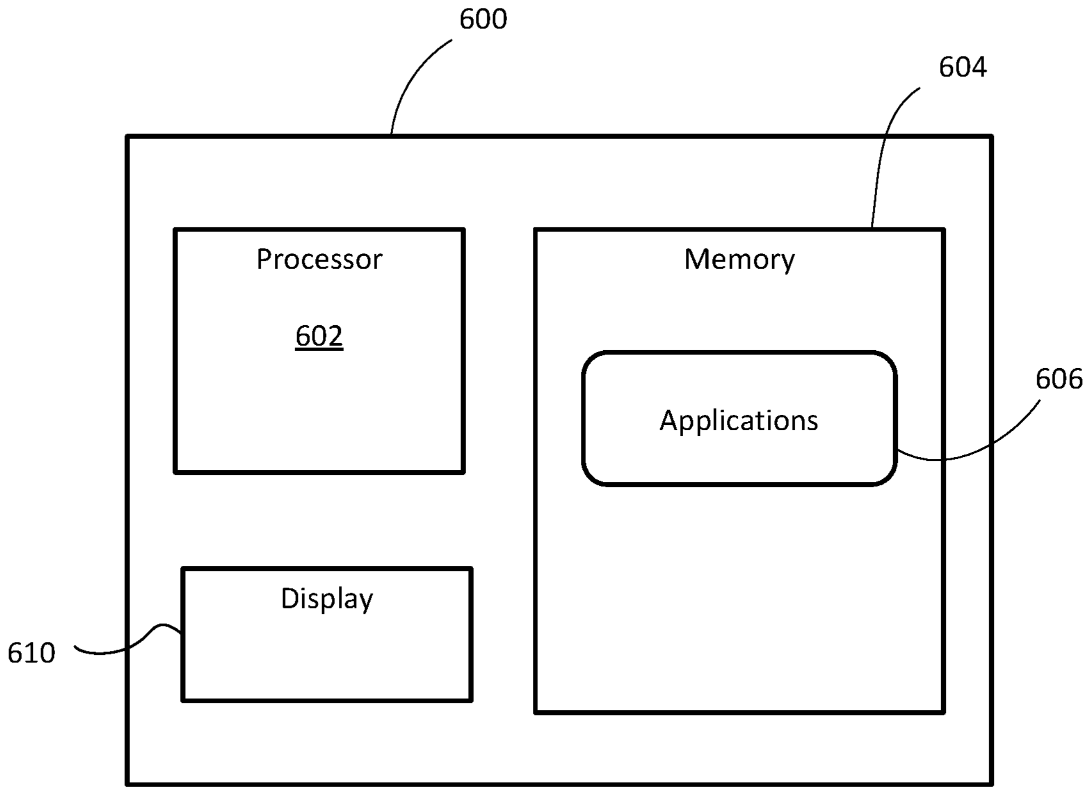
FIG. 6 illustrates a simplified block diagram of a remote device, in accordance with an example of the present application.

Reference is made to FIG. 6, which illustrates a simplified block diagram of a client device 600, in accordance with an example of the present application. The client device includes a display 610. In some examples, the client device 600 is a portable electronic device, such as a smartphone device. In some other examples, the client device 600 is a personal computer, a laptop computer, a tablet computer, a wearable computing device, or other type of computing device that is configured to store data and software instructions, and execute software instructions to perform operations consistent with the examples described herein.

The client device 600 includes a processor 602 and memory 604. The memory stores processor-executable instructions in the form of software. The software may include an operating system to provide basic device functions and may include application software. The client device 600 can also include a communication module (not illustrated) for forming a communication link with a network. In some examples, the memory 604 stores applications for providing communication functionality, for example to initiate a telephonic communication session or other type of communication session with the vehicle communication system described herein.

Example embodiments of the present application are not limited to any particular operating system, system architecture, mobile device architecture, server architecture, or computer programming language.

It will be understood that the applications, modules, routines, processes, threads, or other software components implementing the described method/process may be realized using standard computer programming techniques and languages. The present application is not limited to particular processors, computer languages, computer programming conventions, data structures, or other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method of operating a communication system in a vehicle, the vehicle including a first safety belt securable around a vehicle occupant, the method comprising:

detecting, at a microphone, a first acoustic input and, in response, determining that the first acoustic input corresponds to first audible speech at a speech time;

detecting vibration associated with a speaking vehicle occupant at a vibration time using a vibration sensor associated with the first safety belt;

determining that the vibration time substantially corresponds to the speech time to identify that the first audible speech originates from the vehicle occupant on which the first safety belt is secured about; and in response to identifying that the first audible speech originates from the vehicle occupant associated with the first safety belt, adjusting loudspeaker output of at least one loudspeaker.

2. The method of claim 1, further comprising:

prior to adjusting the loudspeaker output of the at least one loudspeaker, determining that a telephonic call originating from a mobile device external to the vehicle is in communication with the communication system; and reducing loudspeaker output of the at least one loudspeaker for the duration of the detected telephonic call.

3. The method of claim 1, wherein the vehicle includes a plurality of acoustic zones, and wherein the respective acoustic zones are associated with a corresponding loudspeaker, and wherein the first safety belt is associated with a first acoustic zone from which the first audible speech originates, and wherein the method further comprising:

prior to adjusting the loudspeaker output of the at least one loudspeaker, determining that a second acoustic input detected by the microphone and that vibration detected by a second vibration sensor associated with a second safety belt corresponds to second audible speech originating from a second acoustic zone; and in response to identifying the second audible speech from the second acoustic zone, adjusting loudspeaker output of said at least one loudspeaker in the first acoustic zone and a second loudspeaker in the second acoustic zone.

4. The method of claim 3, wherein adjusting the loudspeaker output includes adjusting loudspeaker balance among a plurality of loudspeakers about the vehicle interior to reduce loudspeaker output in acoustic zones from which audible speech originates.

5. The method of claim 3, further comprising, prior to adjusting the loudspeaker output, storing primary loudspeaker output settings.

6. The method of claim 5, further comprising determining that audible speech is detected in less than two acoustic zones for greater than a threshold time and, in response, restoring loudspeaker output based on the prior stored primary loudspeaker output settings.

7. The method of claim 1, wherein detecting vibration at the first safety belt includes detecting vibration having an amplitude greater than a voice threshold for detecting chest vibration during audible speech from the speaking vehicle occupant.

8. The method of claim 1, wherein determining that the first acoustic input corresponds to audible speech includes identifying using a speech recognition engine that the first acoustic input is an utterance that is audible speech.

9. The method of claim 1, wherein the microphone is positioned on the first safety belt.

10. The method of claim 1, wherein the vehicle includes a seat vibration sensor associated with a first occupant seat, and wherein detecting vibration further includes detecting vibration associated with the speaking occupant at the vibration time using the seat vibration sensor associated with the first occupant seat.

11. The method of claim 1, wherein adjusting loudspeaker output of at least one loudspeaker includes decrementing loudspeaker output volume.

12. A communication system in a vehicle, the communication system comprising:

a first safety belt having a vibration sensor for detecting vibrations from a vehicle occupant when the first safety belt is secured around the vehicle;

a loudspeaker;

a microphone;

a processor coupled to the first safety belt, the loudspeaker, and the microphone;

a memory coupled to the processor; and an aural manager including processor executable instructions stored in the memory that, when executed, cause the processor to:

detect, at the microphone, a first acoustic input and, in response, determine that the first acoustic input corresponds to first audible speech at a speech time;

detect vibration associated with a speaking vehicle occupant at a vibration time using a vibration sensor associated with the first safety belt;

determine that the vibration time substantially corresponds to the speech time to identify that the first audible speech originates from the vehicle occupant on which the first safety belt is secured about; and in response to identifying that the first audible speech originates from the vehicle occupant associated with the first safety belt, adjust loudspeaker output of at least one loudspeaker.

13. The system of claim 12, wherein the processor executable instructions, when executed, further cause the processor to:

prior to adjusting the loudspeaker output of the at least one loudspeaker, determine that a telephonic call originating from a mobile device external to the vehicle is in communication with the communication system; and reduce loudspeaker output of the at least one loudspeaker for the duration of the detected telephonic call.

14. The system of claim 12, wherein the vehicle includes a plurality of acoustic zones, and wherein the respective acoustic zones are associated with a corresponding loudspeaker, and wherein the first safety belt is associated with a first acoustic zone from which the first audible speech originates, and wherein the processor executable instructions, when executed, further cause the processor to:

prior to adjusting the loudspeaker output of the at least one loudspeaker, determine that a second acoustic input detected by the microphone and that vibration detected by a second vibration sensor associated with a second safety belt corresponds to second audible speech originating from a second acoustic zone; and in response to identifying the second audible speech from the second acoustic zone, adjust loudspeaker output of said at least one loudspeaker in the first acoustic zone and a second loudspeaker in the second acoustic zone.

15. The system of claim 14, wherein adjusting the loudspeaker output includes adjusting loudspeaker balance among a plurality of loudspeakers about the vehicle interior to reduce loudspeaker output in acoustic zones from which audible speech originates.

16. The system of claim 14, wherein the processor executable instructions, when executed, further cause the processor to, prior to adjusting the loudspeaker output, store primary loudspeaker output settings.

17. The system of claim 16, wherein the processor executable instructions, when executed, further cause the processor to: determine that audible speech is detected in less than two acoustic zones for greater than a threshold time and, in response, restore loudspeaker output based on the prior stored primary loudspeaker output settings.

18. The system of claim 12, wherein detecting vibration at the first safety belt includes detecting vibration having an amplitude greater than a voice threshold for detecting chest vibration during audible speech from the speaking vehicle occupant.

19. The system of claim 12, further comprising a first occupant seat having a seat vibration sensor for detecting vibrations from the vehicle occupant when the vehicle occupant is seated in the first occupant seat, and wherein detecting vibration further includes processor executable instructions stored in the memory that, when executed, cause the processor to detect vibration associated with the speaking occupant at the vibration time using the seat vibration sensor associated with the first occupant seat.

20. A non-transitory computer-readable medium storing processor readable instructions for operating a communication system in a vehicle, the vehicle including a first safety belt securable around a vehicle occupant, wherein the instructions, when executed by a processor of the communication system, cause the communication system to:

detect, at a microphone, a first acoustic input and, in response, determine that the first acoustic input corresponds to first audible speech at a speech time;

detect vibration associated with a speaking vehicle occupant at a vibration time using a vibration sensor associated with the first safety belt;

determine that the vibration time substantially corresponds to the speech time to identify that the first audible speech originates from the vehicle occupant on which the first safety belt is secured about; and in response to identifying that the first audible speech originates from the vehicle occupant associated with the first safety belt, adjust loudspeaker output of at least one loudspeaker.

* * * * *